United States Patent [19]

Englund

[11] 4,232,365
[45] Nov. 4, 1980

[54] APPARATUS FOR DETERMINING THE NEXT ADDRESS OF A REQUESTED BLOCK IN INTERLACED ROTATING MEMORIES

[75] Inventor: Robert M. Englund, Golden Valley, Minn.

[73] Assignee: Sperry Corporation, New York, N.Y.

[21] Appl. No.: 882,491

[22] Filed: Mar. 1, 1978

[51] Int. Cl.³ .................... G06F 13/04; G11C 8/00
[52] U.S. Cl. ............................................. 364/200
[58] Field of Search ... 364/900 MS File, 200 MS File; 364/48, 49

[56] References Cited

U.S. PATENT DOCUMENTS

| | | | |
|---|---|---|---|
| 3,327,294 | 6/1967 | Furman et al. | 364/900 |
| 3,350,694 | 10/1967 | Kusnick et al. | 364/900 |
| 3,355,718 | 11/1967 | Talarczyk | 364/200 |
| 3,829,837 | 8/1974 | Farr, Jr. | 364/200 |

Primary Examiner—Melvin B. Chapnick
Attorney, Agent, or Firm—John L. Rooney; Kenneth T. Grace; Marshall M. Truex

[57] ABSTRACT

Apparatus for determining the next data word of a requested block of data words in interlaced rotating mass memories to enable transfer of the requested block from other than the first word in the block to reduce the effective average latency. The system assumes the use of a memory storage element which is read in a serial rotational fashion (e.g., drum, disk, charge coupled device, etc.). The present invention compares the address of the data requested by a Central Processor Unit (CPU) with the address from the interlaced memory storage element that indicates its present rotational position. From these addresses, it computes the address of the next accessible cell within the requested block and transfers that address to the CPU to enable it to access the requested block at the earliest possible time.

4 Claims, 16 Drawing Figures

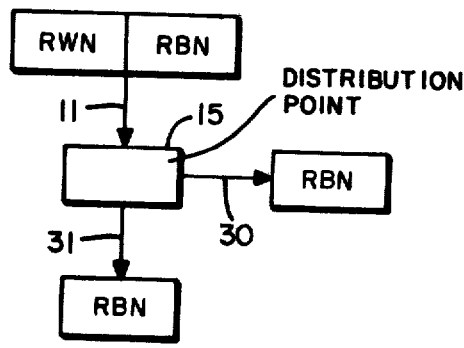
_Fig. 5a_
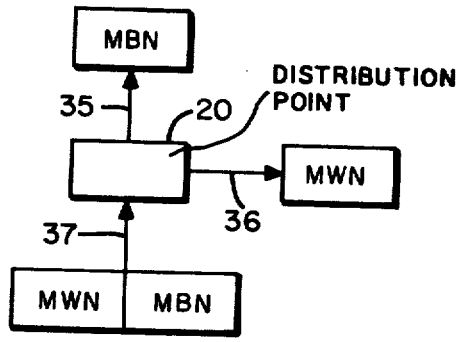
_Fig. 5b_
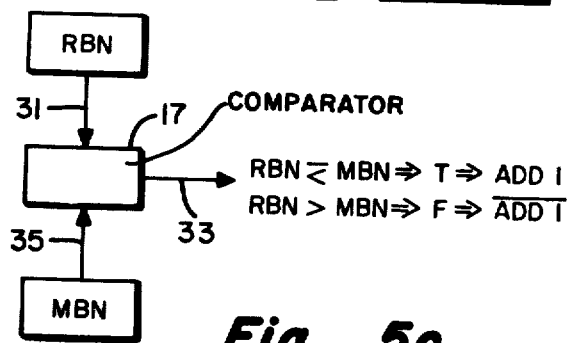
_Fig. 5c_
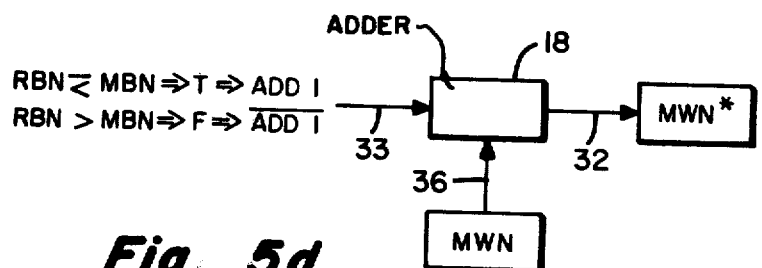
_Fig. 5d_
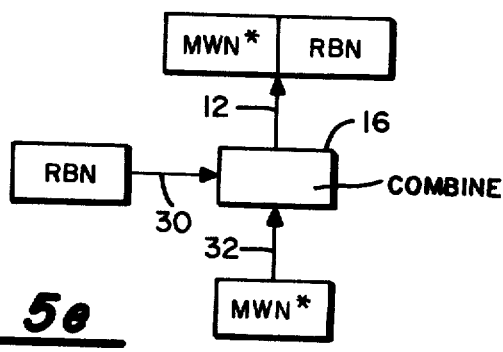
_Fig. 5e_

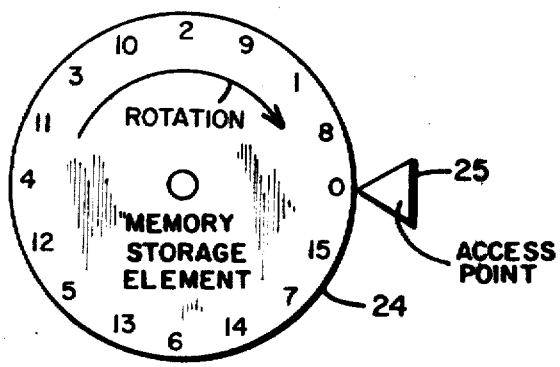
_Fig. 6a_
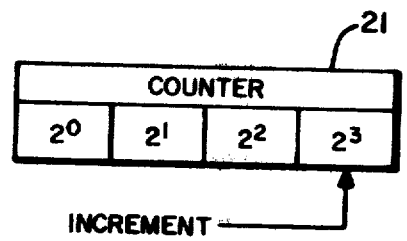
_Fig. 6b_
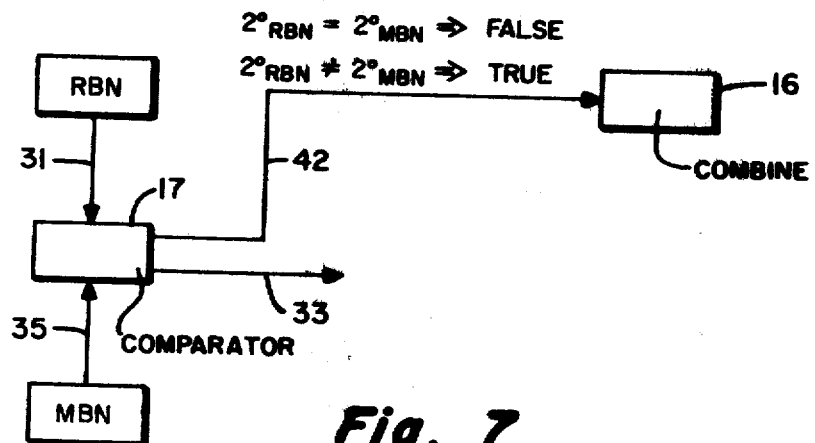
_Fig. 7_

APPARATUS FOR DETERMINING THE NEXT ADDRESS OF A REQUESTED BLOCK IN INTERLACED ROTATING MEMORIES

BACKGROUND OF THE INVENTION

This invention relates to data processing systems and more particularly to the use of memory storage subsystems employing memory storage elements which are accessed in a serial rotational fashion.

The use of memory storage elements with serial rotational characteristics has been known for some time. Many different electromechanical and semiconductor technologies have produced memory storage elements which exhibit some of the same functional characteristics. The common characteristic of concern, herein, is the serial rotational nature of these storage elements which may be defined as the tendency of each sequential cell to move in time functionally (and perhaps physically) to and away from the memory storage element access point in a cyclic manner. This tendency makes the average length of time required to access a given cell dependent upon the rotational speed of the memory storage element. The length of time required to make one complete rotation is called cycle time. The average length of time required to access a given cell because of this tendency is called average latency. Since it is desirable to minimize average latency, it has been common in the art to increase the rotational speed (i.e., decrease the cycle time) of the memory storage element. It should be added that increasing rotational speed is not without its practical limits as this causes increased input power requirements, increased physical and electrical component stress, and decreased signal-to-noise ratio.

An increase of rotational speed also decreases the transfer time, as transfer time is the length of time it takes the memory storage element to rotate from access to one cell to access to the next sequentially addressable cell. It was found in many cases that rotational speeds causing desirably low average latency within acceptable power, stress and signal-to-noise ratio ranges, produced transfer times sufficiently low as to tax the Input-/Output (I/O) capacities of the accessing mainframe computer referred to herein as the Central Processor Unit (CPU). Transfer times which are too low also produce priority conflict problems amongst I/O devices.

The common technique used to solve the problem of insufficient transfer time at desirable rotational speeds is called interlace. Interlace is a recording method wherein the cells found physically sequential within the memory storage element are not addressed sequentially by the Central Processor Unit (CPU). A very simple example might be the sequential addressing of every second physical cell within the memory storage element, called two-to-one interlace. This would provide double the transfer time without affecting the rotational speed and, therefore, the average latency.

The interlace method adapted for a given application may sequentially address every third, fourth, or nth physically sequential storage cell, depending upon the desired relationship between rotational speed and transfer time.

Present art normally utilizes interlaced serial rotational memory storage elements by having the CPU transfer an address identifying the first cell within a sequentially addressable block of cells to the memory storage subsystem which begins transferring the requested data at such time as that addressed first cell rotates past the memory storage element access point. If the requests from the CPU are truly random addresses made at times asynchronous to the cycle of the memory storage element, the average latency becomes one-half the cycle time of the memory storage element.

The present invention lowers this effective average latency experienced by the accessing CPU by permitting the transfer of the requested data block from any (rather than just the first) cell within that block by providing an apparatus that forecasts the address of the first cell to be transferred.

SUMMARY OF THE INVENTION

In the present art, memory storage subsystems containing interlaced serial rotational memory storage elements utilize devices to maintain the current rotational position of the memory storage elements. Such a device is normally a counter which is reset to an initial value as an initial cell passes the memory storage element access point and which is incremented as each sequential cell is rotated past the memory storage element access point. With the earlier electromechanical serial rotational storage elements, the precise instantaneous rotational speed was determined by the electromechanical apparatus and the counter was synchronized to the memory storage element by various means. This configuration may be termed asynchronous to distinguish it from the synchronous nature of modern semiconductor memory storage elements wherein updating of the counter and the instantaneous rotational speed are established from the same time standard. The present art memory storage subsystem need only compare the value of that counter against the request address transferred to it by the CPU; when equality of that comparison is determined, the CPU may begin to access the memory storage element.

The present invention increments the counter in a manner that provides the memory storage subsystem with the address of the next physically sequential cell that rotates to the memory storage element access point, compares the counter with the address transferred as the CPU's access request, computes the next physically accessible cell within the data block requested, and transfers this computed address to the CPU. The CPU may then elect to begin access to the memory storage element from other than the initial cell within the data block desired.

BRIEF DESCRIPTION OF THE DRAWINGS

FIG. 2b illustrates the format for a counter to maintain the rotational position of the memory storage element in FIG. 2a.

FIG. 3b illustrates the format for a counter to maintain the rotational position of the memory storage element of FIG. 3a.

FIG. 3c illustrates another format for a counter to maintain the rotational position of the memory storage element in FIG. 3a.

FIG. 5a illustrates the disassembly function of the improved memory storage subsystem element DISA.

FIG. 5b illustrates the disassembly function of the improved memory storage subsystem element DISB.

FIG. 5c illustrates the compare function of the improved memory storage subsystem element COM.

FIG. 5d illustrates the selective addition function of the improved memory storage subsystem element ADD.

FIG. 5e illustrates the combining function of the improved memory storage subsystem element COMBINE.

FIG. 6a illustrates the format of a serial rotational memory storage element of 16 cells employing two-to-one interlace.

FIG. 6b illustrates the format for a counter to maintain the rotational position of the memory storage element in FIG. 6a.

FIG. 7 illustrates the modified operation of element COM 17 for the format used in FIG. 6a.

DETAILED DESCRIPTION OF THE PREFERRED EMBODIMENTS

The present invention is described through an example using a generalized serial rotational memory storage element of small capacity employing four-to-one interlace. This is followed by a discussion which describes the effect of using the same memory storage element with two-to-one interlace. Finally, the effect of using memory with storage elements of larger capacity is discussed.

Figure 1:
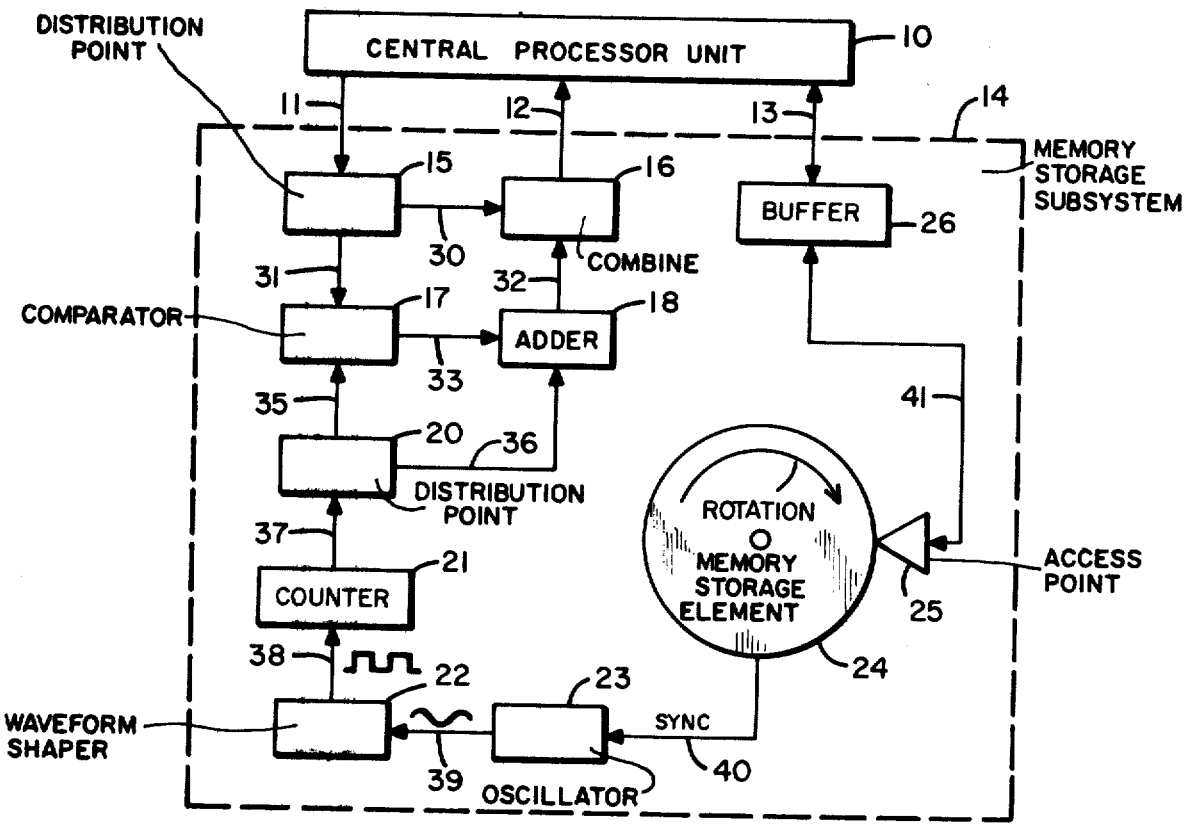
FIG. 1 is an illustration of the improved serial rotational memory storage subsystem as interfaced to the Central Processor Unit.

FIG. 1 shows the general arrangement wherein a Central Processor Unit, CPU 10, is connected to the improved memory storage subsystem, MSS 14, via lines 11, 12 and 13. Line 11 is used to transfer commands to MSS 14 and line 12 is used to transfer responses from MSS 14 to CPU 10. The multiconductor cable 13 is a bidirectional path for transfer of data between CPU 10 and MSS 14 through Buffer 26 which serves to hold data going to and from the serial rotational memory storage element, MSE 24, for transfer synchronization. The function and nature of Buffer 26 is well known in the art and so it will not be explained in detail herein. The data access to MSE 24 is accomplished through access point, AP 25. Line 41 is a bidirectional data line between Buffer 26 and AP 25. The oscillator, OSC 23, oscillates with a natural period approximately equal to the transfer time of MSE 24. OSC 23 is synchronized with the rotation of MSE 24 by a sync signal supplied via line 40. As previously explained, having OSC 23 synchronized from MSE 24 is typical of electromechanical memory storage elements. Were MSE 24 embodied in a semiconductor device, it would probably be synchronously driven by OSC 23. As the present invention applies equally to either configuration, only the former is disclosed herein. The waveform shaper, WFS 22, merely converts the sinusoidal output of OSC 23, received via line 39, to a digital pulse train which is transferred via line 38 to Counter 21. The pulse train causes counter 21 to be incremented once each transfer time to enable it to maintain the address (or number) of the cell of MSE 24 adjacent to AP 25. Notice that in this way, the output of OSC 23 (and hence the pulse train output from WFS 22 via line 38) is the time standard which synchronizes the operation of the disclosed apparatus.

Figure 2A:
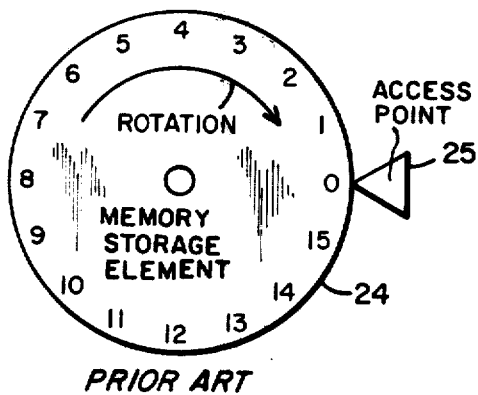
FIG. 2a illustrates the format of a non-interlaced serial rotational memory storage element.
Figure 2B:
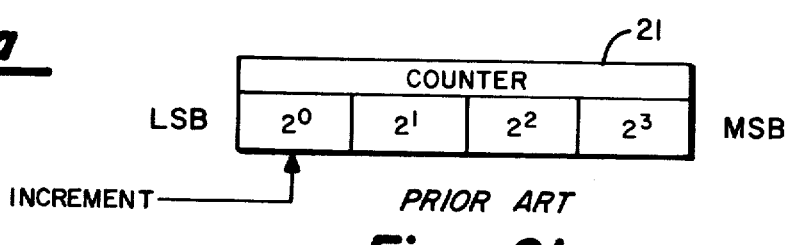

FIG. 2a represents functionally the format of MSE 24 wherein MSE 24 contains 16 cells addressed (or numbered) from 0 to 15. These cells are arranged in sequential order on MSE 24 in such a fashion that the memory storage element access point, AP 25, may access each of the 16 cells in the sequential order of the 16 addresses from 0 to 15 as the memory storage element is rotated in the direction of the arrow shown. This is the format of a non-interlaced serial rotational memory storage element. FIG. 2b provides the format of Counter 21 which may be used to address the 16 cells of the memory storage element shown in FIG. 2a.

As the cell which is located at address 0 is rotated to AP 25, Counter 21 is cleared (i.e., all bit positions set to 0). This happens as Counter 21 is incremented one count past 15 (all bit positions set to 1). As the memory storage element is rotated past address 0 to the cell located at address 1, the counter is incremented (i.e., 1 is added to the binary contents of the counter) to produce a counter configuration represented by bit position $2^0$ set to 1 and bit positions $2^1$, $2^2$ and $2^3$ all set to 0. The counter will continue to be incremented in this fashion each transfer time until it reaches 15 (i.e., $2^0$, $2^1$, $2^2$ and $2^3$ all set to 1's). At that point AP 25 will have access to the cell at address 15. During the next transfer time, the memory storage element will rotate until AP 25 is again adjacent to the cell at address 0 and the counter is cleared. This progression completes one cycle of MSE 24 which is then repeated. The function of the counter is to maintain the address of the cell which may be accessed by AP 25 at any point in time to indicate the one of the 16 cells of MSE 24 being accessed at that time. Table A, below, shows the relationship between the addresses of the 16 cells of MSE 24 in FIG. 2a and the 16 possible values of Counter 21 shown in FIG. 2b.

The reference column identifies each cell accessed by AP 25 in sequential order from A through P and provides a convenient means to specify a particular one of the 16 entries of Table A. The contents of Counter 21 are given as the binary value of each of the four bit positions. The final column provides the decimal address of the cell of the memory storage element which is positioned at the memory storage element access pointer, AP 25.

Figure 3A:
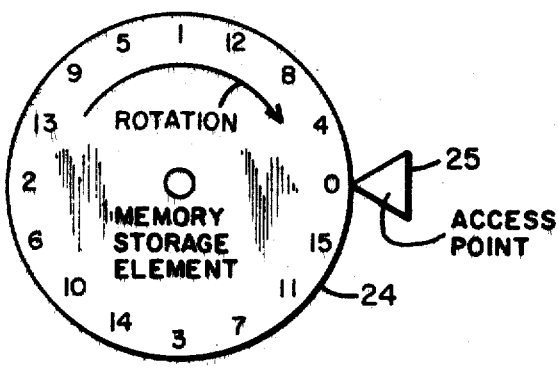
FIG. 3a illustrates the format of a serial rotational memory storage element employing four-to-one interlace.

FIG. 3a illustrates a 16 cell memory storage element which employs four-to-one interlace. This format provides addresses which uniquely identify the 16 cells of the memory storage element but which are not physically sequential. The interlace format, as previously explained, provides for an increase of transfer time over a non-interlaced memory storage element without a corresponding change in rotational speed or average latency. The format shown in FIG. 3a is called four-to-one interlace because it increases the transfer time by a factor of approximately four over a non-interlaced format using a physically similar memory storage element. The memory storage element access point is shown as AP 25.

Figure 3B:
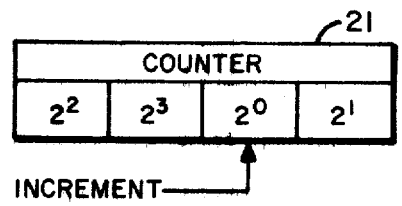
Figure 3C:
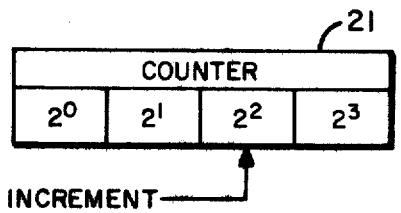

FIG. 3b shows Counter 21 configured to maintain the rotational position of the memory storage element formatted as in FIG. 3a. It is equivalent to the counter shown in FIG. 2b with bit positions $2^0$ and $2^2$ and bit positions $2^1$ and $2^3$ reversed. FIG. 3c represents this reversal more clearly by showing a counter as in FIG.

2b wherein the incrementation of the counter is effected at bit-position $2^2$ rather than at bit position $2^0$.

TABLE A

| REFERENCE | CONTENTS OF COUNTER 21 | | | | ADDRESS OF CELL AT AP 25 |
|---|---|---|---|---|---|
| | $2^0$ | $2^1$ | $2^2$ | $2^3$ | |
| A | 0 | 0 | 0 | 0 | 0 |
| B | 1 | 0 | 0 | 0 | 1 |
| C | 0 | 1 | 0 | 0 | 2 |
| D | 1 | 1 | 0 | 0 | 3 |
| E | 0 | 0 | 1 | 0 | 4 |
| F | 1 | 0 | 1 | 0 | 5 |
| G | 0 | 1 | 1 | 0 | 6 |
| H | 1 | 1 | 1 | 0 | 7 |
| I | 0 | 0 | 0 | 1 | 8 |
| J | 1 | 0 | 0 | 1 | 9 |
| K | 0 | 1 | 0 | 1 | 10 |
| L | 1 | 1 | 0 | 1 | 11 |
| M | 0 | 0 | 1 | 1 | 12 |
| N | 1 | 0 | 1 | 1 | 13 |
| O | 0 | 1 | 1 | 1 | 14 |
| P | 1 | 1 | 1 | 1 | 15 |

Table B is formatted in the same manner as Table A with the sequential accesses by AP 25 represented by references A through P. A comparison of Table B with Table A shows the effect of a four-to-one interlace of a 16 cell memory storage element formatted as in FIG. 3a.

Figure 4A:
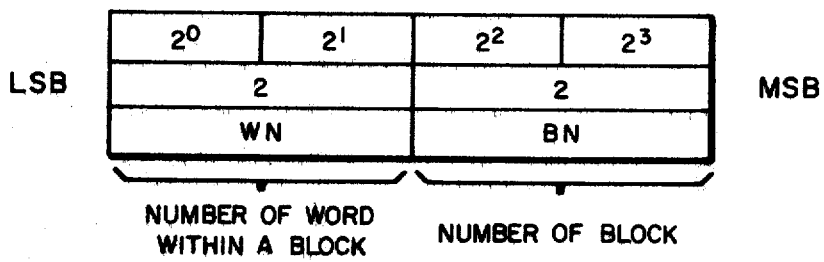
FIG. 4a illustrates the address word format used with a 16 cell memory storage element arranged in four blocks of four words each.

To further describe this embodiment, a memory storage element formatted in accordance with the 16 cell memory storage element illustrated in FIG. 3a (i.e., 16 cells of storage with four-to-one interlace) is assumed. It will also be assumed that the data written into and accessed from the 16 cells of the memory storage element will be in four blocks of four consecutively addressed cells such that addresses 0–3 constitute block 0, addresses 4–7 constitute block 1, addresses 8–11 constitute block 2, and addresses 12–15 constitute block 3. This type of restriction upon accesses to the memory storage element is common in the art. Referring to FIG. 1, at such time as CPU 10 desires to access a block of four cells from MSE 24, it transfers the requested address of the first cell within that block (i.e., address 0→block 0, address 4→block 1, address 8→block 2, and address 12→block 3) to Distribution Point A (i.e., a terminal block being a mere electrically wired connection branch), DISA 15. FIG. 4a shows the format of the address transferred to DISA 15 via line 11. It is an address containing four bit positions which are sufficient to uniquely identify (or address) one of the 16 cells of MSE 24. The four bits of that address correspond to a block number, BN, (i.e., the one of four blocks within MSE 24) and a word number, WN (i.e., the number of the one of the four cells within the indicated block of four cells). As seen in FIG. 5a, DISA 15 receives the requested address via line 11 as a requested block number, RBN, and a requested word number, RWN.

TABLE B

| REFERENCE | CONTENTS OF COUNTER | | | | ADDRESS OF CELL AT AP 25 |
|---|---|---|---|---|---|
| | $2^0$ | $2^1$ | $2^2$ | $2^3$ | |
| A | 0 | 0 | 0 | 0 | 0 |
| B | 0 | 0 | 1 | 0 | 4 |
| C | 0 | 0 | 0 | 1 | 8 |
| D | 0 | 0 | 1 | 1 | 13 |
| E | 1 | 0 | 0 | 0 | 1 |
| F | 1 | 0 | 1 | 0 | 5 |
| G | 1 | 0 | 0 | 1 | 9 |
| H | 1 | 0 | 1 | 1 | 13 |
| I | 0 | 1 | 0 | 0 | 2 |
| J | 0 | 1 | 1 | 0 | 6 |
| K | 0 | 1 | 0 | 1 | 10 |
| L | 0 | 1 | 1 | 1 | 14 |
| M | 1 | 1 | 0 | 0 | 3 |
| N | 1 | 1 | 1 | 0 | 7 |
| O | 1 | 1 | 0 | 1 | 11 |
| P | 1 | 1 | 1 | 1 | 15 |

DISA 15 separates the requested block number, RBN, and transfers it to COMBINE 16 via line 30. COMBINE 16 is a mere electrically wired connection branch which simply juxtaposes or combines the fields RBN and MWN* to produce a parallel data quantity having these two fields as explained below (see FIG. 5e) and COM 17 via line 31 (see FIG. 5c). See also FIG. 1.

The contents of Counter 21 may also be described as consistent with the format of FIG. 4a. By comparing FIG. 3c, the format of the counter, with FIG. 4a, the format of an address on MSE 24, it can be seen that it is the Block Number, BN, field (i.e., bit positions $2^2$ and $2^3$) which is incremented. Reference to Table B will confirm that the format in FIG. 4a can be used to represent the value of Counter 21. Counter 21 transfers its contents to Distribution Point B (i.e., a terminal block being a mere electrically wired connection branch), DISB 20, via line 37 as is illustrated in FIG. 1. DISB 20 disassembles the address (value of Counter 21) and transfers the Block Number to four-bit Comparator, COM 17, via line 35 (see FIG. 5c) and the Word Number to four-bit Adder, ADD 18, via line 36 (see FIG. 5d). FIG. 5b provides a detailed illustration of the function of DISB 20. The contents of Counter 21 can be represented as being comprised of the memory word number, MWN, and the memory block number, MBN, as discussed above. DISB 20 receives MWN and MBN via line 37. It disassembles this address and transfers MBN to COM 17 via line 35 (see FIG. 5c) and MWN to ADD 18 via line 36 (see FIG. 5d).

FIG. 5c shows that the function of COM 17 is to compare the requested block number, RBN, with the memory block number, MBN. RBN is received from DISA 15 via line 31 and MBN is received from DISB 20 via line 35. FIG. 5c shows that COM 17 receives RBN via line 31 and MBN via line 35. The comparison made by COM 17 is to determine if RBN is less than or equal to MBN or if RBN is greater than MBN. COM 17 sets line 33 true (T) if RBN≦MBN. COM 17 sets line 33 false (F) if RBN>MBN. COM 17 is a four-bit comparator which may be implemented using a common monolithic device such as industry standard part number 54LS85. As shown in FIG. 1, ADD 18 senses line 33 from COM 17. If line 33 is true, ADD 18 adds one to the quantity received from DISB 20 via line 36. If line 33 is false, ADD 18 does not add one to the quantity received from DISB 20 via line 36. ADD 18 transfers the modified or unmodified quantity to COMBINE 16 via line 32. FIG. 5d shows the function of ADD 18 in detail. ADD 18 receives the memory word number, MWN, via line 36. ADD 18 adds one to MWN if line 33 is true and does not add one to MWN if line 33 is false. ADD 18 may be easily implemented using a common four-bit up/down counter such as industry standard part 54LS169 by loading MWN into the set inputs and strapping the device to count up only. The potentially modified quantity, MWN*, is transferred to COMBINE 16 via line 32.

As illustrated in FIG. 1, COMBINE 16 combines the quantities received from DISA 15 via line 30 and from ADD 18 via line 32 and transfers the resultant to CPU 10 via line 12. FIG. 5e presents the details of the function of COMBINE 16. COMBINE 16. INT 16 receives the requested block number, RBN, from DISA 15 via line 30, and the potentially modified memory word number, MWN*, from ADD 18 via line 32. COMBINE 16 combines these two quantities to produce the next address of MSE 24 which is within the same block of four addresses as requested by CPU 10 via line 11 which will next be accessed by AP 25. The Next Address computed is comprised of the requested block number, RBN, and the potentially modified memory word number, MWN*, and is transferred to CPU 10 via line 12.

Table C provides the resultant address (i.e., NEXT ADDRESS) for each possible value of Counter 21 (i.e., MEMORY ADDRESS) for one requested address (i.e., $10_{10}$).

It can be seen that the embodiment described above could produce the correct NEXT ADDRESS for each possible value of Counter 21 (i.e., MEMORY ADDRESS).

TABLE C

| | REQUESTED ADDRESS | | | | | MEMORY (CURRENT) ADDRESS | | | | | NEXT ADDRESS | | | | |
|---|---|---|---|---|---|---|---|---|---|---|---|---|---|---|---|
| | RWN | | RBN | | | MWN | | MBN | | | MWN* | | RBN | | |
| REF | $2^0$ | $2^1$ | $2^2$ | $2^3$ | DECIMAL | $2^0$ | $2^1$ | $2^2$ | $2^3$ | DECIMAL | $2^0$ | $2^1$ | $2^2$ | $2^3$ | DECIMAL |
| A | 0 | 1 | 0 | 1 | 10 | 0 | 0 | 0 | 0 | 0 | 0 | 0 | 0 | 1 | 8 |
| B | 0 | 1 | 0 | 1 | 10 | 0 | 0 | 1 | 0 | 4 | 0 | 0 | 0 | 1 | 8 |
| C | 0 | 1 | 0 | 1 | 10 | 0 | 0 | 0 | 1 | 8 | 1 | 0 | 0 | 1 | 9 |
| D | 0 | 1 | 0 | 1 | 10 | 0 | 0 | 1 | 1 | 12 | 1 | 0 | 0 | 1 | 9 |
| E | 0 | 1 | 0 | 1 | 10 | 1 | 0 | 0 | 0 | 1 | 1 | 0 | 0 | 1 | 9 |
| F | 0 | 1 | 0 | 1 | 10 | 1 | 0 | 1 | 0 | 5 | 1 | 0 | 0 | 1 | 9 |
| G | 0 | 1 | 0 | 1 | 10 | 1 | 0 | 0 | 1 | 9 | 0 | 1 | 0 | 1 | 10 |
| H | 0 | 1 | 0 | 1 | 10 | 1 | 0 | 1 | 1 | 13 | 0 | 1 | 0 | 1 | 10 |
| I | 0 | 1 | 0 | 1 | 10 | 0 | 1 | 0 | 0 | 2 | 0 | 1 | 0 | 1 | 10 |
| J | 0 | 1 | 0 | 1 | 10 | 0 | 1 | 1 | 0 | 6 | 0 | 1 | 0 | 1 | 10 |
| K | 0 | 1 | 0 | 1 | 10 | 0 | 1 | 0 | 1 | 10 | 1 | 1 | 0 | 1 | 11 |
| L | 0 | 1 | 0 | 1 | 10 | 0 | 1 | 1 | 1 | 14 | 1 | 1 | 0 | 1 | 11 |
| M | 0 | 1 | 0 | 1 | 10 | 1 | 1 | 0 | 0 | 3 | 1 | 1 | 0 | 1 | 11 |
| N | 0 | 1 | 0 | 1 | 10 | 1 | 1 | 1 | 0 | 7 | 1 | 1 | 0 | 1 | 11 |
| O | 0 | 1 | 0 | 1 | 10 | 1 | 1 | 0 | 1 | 11 | 0 | 0 | 0 | 1 | 8 |
| P | 0 | 1 | 0 | 1 | 10 | 1 | 1 | 1 | 1 | 15 | 0 | 0 | 0 | 1 | 8 |

This would require 15 additional tables formatted as Table C.

The embodiment just disclosed is applicable to a memory storage element which is formatted in such a way that each block of data occupies an entire rotation of MSE 24. It is desirable in certain circumstances to employ interlace formats which position an entire block within but a fraction of a rotation. FIG. 6a shows a 16 cell MSE 24 which is formatted with two-to-one interlace. This provides an entire block of four cells within one-half rotation of MSE 24.

FIG. 6b shows the format of counter 21 which identifies the address of the cell located at the memory storage element access point, AP 25. Notice that the most significant bit position (i.e., bit position $2^3$) is incremented. Table D provides each of the possible values of counter 21 as MSE 24 is rotated.

As stated above, this two-to-one interlace format positions a four cell block within one-half rotation of MSE 24, which necessitates a slightly different embodiment of the present invention. Because the four cells of a requested block are not evenly spaced around MSE 24, two situations can occur depending upon the relative timing of a request and the rotation of MSE 24. At the time of the request, the one-half of MSE 24 containing the requested block may be rotating past AP 25 or it may not. In the former case the present invention operates much as in the previously disclosed embodiment. In the latter case, however, MWN* will always be the first cell within the requested block. Stated another way, transfer of the requested block to the CPU may always occur from the first cell within that block, if that portion of MSE 24 is not rotating past AP 25 at the time the request is received.

TABLE D

| REFERENCE | CONTENTS OF COUNTER | | | | ADDRESS OF CELL AT AP |
|---|---|---|---|---|---|
| | $2^0$ | $2^1$ | $2^2$ | $2^3$ | |
| A | 0 | 0 | 0 | 0 | 0 |
| B | 0 | 0 | 0 | 1 | 8 |
| C | 1 | 0 | 0 | 0 | 1 |
| D | 1 | 0 | 0 | 1 | 9 |
| E | 0 | 1 | 0 | 0 | 2 |
| F | 0 | 1 | 0 | 1 | 10 |
| G | 1 | 1 | 0 | 0 | 3 |
| H | 1 | 1 | 0 | 1 | 11 |
| I | 0 | 0 | 1 | 0 | 4 |
| J | 0 | 0 | 1 | 1 | 12 |
| K | 1 | 0 | 1 | 0 | 5 |
| L | 1 | 0 | 1 | 1 | 13 |
| M | 0 | 1 | 1 | 0 | 6 |
| N | 0 | 1 | 1 | 1 | 14 |
| O | 1 | 1 | 1 | 0 | 7 |
| P | 1 | 1 | 1 | 1 | 15 |

This can most easily be embodied as shown in FIG. 7. FIG. 7 is a detailed drawing of a portion of MSS 14 as illustrated in FIG. 1. The only difference is that COM 17 has an additional function and line 42 has been added. The additional function of COM 17 is to determine whether the requested block is or is not located within that portion of MSE 24 presently rotating past AP 25. If COM 17 determines that the requested data block is not located within that portion of MSE 24 presently rotating past AP 25, it signals INT 16 via line 42 to set MWN* to all zeros. In the present example, COM 17 compares the least significant bits of RBN and MBN. If they are equal (i.e., $2^0{}_{RBN}=1=2^0{}_{MBN}$ or $2^0{}_{RBN}=0=2^0{}_{MBN}$), the requested data block is within that portion of MSE 24 presently rotating past AP 25 (i.e., line 42→false) and MWN* is determined as before. If $2^0{}_{RBN}\neq 2^0{}_{MBN}$, COM 17 notifies COMBINE 16 by setting line 42 true. This causes COMBINE 16 to transfer an MWN* of zero to CPU 10. The result of this additional function is shown by the example in Table E. Notice that it is formatted similar to Table C except that the state of line 42 is provided. Whenever line 42 is true, MWN* is zero. Whenever line 42 is false, MWN* is determined as before (i.e., MWN*=MWN if RBN>MBN and MWN*=MWN+1 if RBN≦MBN).

Figure 4B:
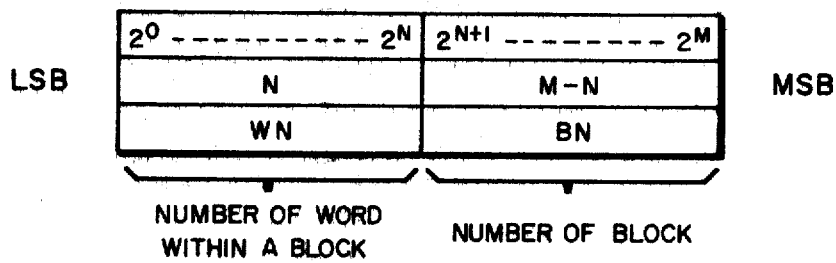
FIG. 4b illustrates the address word format used with a $2^M$ cell memory storage element arranged in M-N blocks of N words each.

It can be easily seen that the disclosed invention is applicable to memory storage subsystems, MSS 14, which have interlaced serial rotational memory storage elements, MSE 24, of capacities greater than 16 cells. The format of the address (i.e., requested address, memory address and next address) used to identify one cell of the $2^M$ cells of an embodiment of MSE 24 of capacity $2^M$ is illustrated in FIG. 4b.

TABLE E

| | REQUESTED ADDRESS | | | | | MEMORY (CURRENT) ADDRESS | | | | | | NEXT ADDRESS | | | | |
|---|---|---|---|---|---|---|---|---|---|---|---|---|---|---|---|---|
| | RWN | | RBN | | | MWN | | MBN | | | | MWN* | | RBN | | |
| REF | $2^0$ | $2^1$ | $2^2$ | $2^3$ | DECIMAL | $2^0$ | $2^1$ | $2^2$ | $2^3$ | DECIMAL | LINE 42 | $2^0$ | $2^1$ | $2^2$ | $2^3$ | DECIMAL |
| A | 0 | 1 | 0 | 1 | 10 | 0 | 0 | 0 | 0 | 0 | F | 0 | 0 | 0 | 0 | 8 |
| B | 0 | 1 | 0 | 1 | 10 | 0 | 0 | 0 | 1 | 8 | F | 0 | 0 | 0 | 1 | 8 |
| C | 0 | 1 | 0 | 1 | 10 | 1 | 0 | 0 | 0 | 1 | F | 1 | 0 | 0 | 1 | 9 |
| D | 0 | 1 | 0 | 1 | 10 | 1 | 0 | 0 | 1 | 9 | F | 1 | 0 | 0 | 1 | 9 |
| E | 0 | 1 | 0 | 1 | 10 | 0 | 1 | 0 | 0 | 2 | F | 0 | 1 | 0 | 1 | 10 |
| F | 0 | 1 | 0 | 1 | 10 | 0 | 1 | 0 | 1 | 10 | F | 0 | 1 | 0 | 1 | 10 |
| G | 0 | 1 | 0 | 1 | 10 | 1 | 1 | 0 | 0 | 3 | F | 1 | 1 | 0 | 1 | 11 |
| H | 0 | 1 | 0 | 1 | 10 | 1 | 1 | 0 | 1 | 11 | F | 1 | 1 | 0 | 1 | 11 |
| I | 0 | 1 | 0 | 1 | 10 | 0 | 0 | 1 | 0 | 4 | T | 0 | 0 | 0 | 1 | 8 |
| J | 0 | 1 | 0 | 1 | 10 | 0 | 0 | 1 | 1 | 12 | T | 0 | 0 | 0 | 1 | 8 |
| K | 0 | 1 | 0 | 1 | 10 | 1 | 0 | 1 | 0 | 5 | T | 0 | 0 | 0 | 1 | 8 |
| L | 0 | 1 | 0 | 1 | 10 | 1 | 0 | 1 | 1 | 13 | T | 0 | 0 | 0 | 1 | 8 |
| M | 0 | 1 | 0 | 1 | 10 | 0 | 1 | 1 | 0 | 6 | T | 0 | 0 | 0 | 1 | 8 |
| N | 0 | 1 | 0 | 1 | 10 | 0 | 1 | 1 | 1 | 14 | T | 0 | 0 | 0 | 1 | 8 |
| O | 0 | 1 | 0 | 1 | 10 | 1 | 1 | 1 | 0 | 7 | T | 0 | 0 | 0 | 1 | 8 |
| P | 0 | 1 | 0 | 1 | 10 | 1 | 1 | 1 | 1 | 15 | T | 0 | 0 | 0 | 1 | 8 |

The $2^M$ cells of MSE 24 are formatted as $2^{M-N}$ blocks of $2^N$ cells per block. The address format produces a Block Number, BN, (i.e., RBN or MBN) of M-N bits and a Word Number, WN, (i.e., RWN, MWN, or MWN*) of N bits. Using the address format as in FIG. 4b, the embodiments previously explained in detail for an MSE 24 of 16 storage cells arranged as four blocks of four cells each merely becomes a special case wherein N=2 and M=4 (which embodiment is utilized is determined by whether or not a block occupies an entire rotation of MSE 24). Therefore, it can be easily seen by those experienced in the art that the present invention is applicable to memory storage subsystems containing $2^M$ cells arranged as $2^{M-N}$ blocks of $2^N$ cells each.

What is claimed is:

1. In a data processing system having a central processor unit (CPU) coupled to a memory storage subsystem which contains an interlaced serial rotational memory storage element of capacity $2^M$ cells whose cells may be accessed only at such point in time as they rotate to a position directly adjacent to a memory storage element access point and wherein the cells of said interlaced serial rotational memory storage element are accessed by said CPU as $2^{M-N}$ blocks of $2^N$ cells per block, where M is greater than N, and wherein each of said $2^M$ cells is identified with a different corresponding one of $2^M$ addresses and each of said $2^M$ addresses contains a block number identifying a one of said $2^{M-N}$ blocks and a word number identifying a one of said $2^N$ cells within the block identified by said block number, wherein said $2^{M-N}$ blocks are arranged such that said $2^{M-N}$ cells of each of said $2^{M-N}$ blocks are equally spaced about the entire rotation of said interlaced serial rotational memory storage element, and having a means responsively coupled to said interlaced serial rotational memory storage element for maintaining a one of said $2^M$ cells currently directly adjacent to said memory storage element access point, whereby said one of said $2^M$ addresses so maintained changes with the rotation of said memory storage element, and having a first transferring means responsively coupled to said memory storage subsystem and said CPU for transferring from said CPU to said memory storage subsystem an address corresponding to a one of the $2^N$ cells within a desired one of said $2^{M-N}$ blocks to be accessed by said CPU, and having a means responsively coupled to said maintaining means and said first transferring means for determining from said one of said $2^M$ addresses corresponding to the one of said $2^M$ cells currently directly adjacent to said memory storage element access point and from said one of said $2^M$ addresses corresponding to said one of said $2^N$ cells within said desired one of said $2^{M-N}$ blocks to be accessed by said CPU, an address corresponding to a one of the $2^N$ cells within said desired one of said $2^{M-N}$ blocks to next become adjacent to said memory storage element access point, and having a second transferring means responsively coupled to said determining means and said CPU for transferring said address determined by said determining means to said CPU to permit it to access said desired one of $2^{M-N}$ blocks from said determined address, said determining means comprising:

first disassembly means responsively coupled to said first transferring means for disassembling said requested address transferred from said CPU into a requested block number identifying one of said $2^{M-N}$ blocks to be accessed and a requested word number identifying one of said $2^N$ storage cells within said requested block number;

second disassembly means responsively coupled to said maintaining means for disassembling said address of said storage cell directly adjacent to said memory storage element access point into a memory block number identifying one of said $2^{M-N}$ blocks and a memory word number identifying one of said $2^N$ storage cells within said memory block number;

a comparator responsively coupled to said first disassembly means and said second disassembly means which compares said requested block number with said memory block number;

means responsively coupled to said comparator and said second disassembly means for selectively adding 1 to said memory word number if and only if said comparator indicates said requested block number is less than or equal to said memory block number; and means responsively coupled to said first disassembly means, said selective adding means, and said second transferring means for combining said requested block number with said memory word number as potentially modified by said selective adding means to produce said determined address to be transferred to said CPU.

2. In a data processing system according to claim 1:
$M = 4$; and
$N = 2$.

3. In a data processing system having a central processor unit (CPU) coupled to a memory storage subsystem which contains an interlaced serial rotational memory storage element of capacity $2^M$ cells whose cells may be accessed only at such point in time as they rotate to a position directly adjacent to a memory storage element access point and wherein the cells of said interlaced serial rotational memory storage element are accessed by said CPU as $2^{M-N}$ blocks of $2^N$ cells per block, where M is greater than N, and wherein each of said $2^M$ cells is identified with a different corresponding one of $2^M$ addresses and each of said $2^M$ addresses contains a block number identifying a one of said $2^{M-N}$ blocks and a word number identifying a one of said $2^N$ cells within the block identified by said block number, wherein said $2^{M-N}$ blocks are not equally spaced about the entire rotation of said interlaced serial rotational memory storage element, and having a means responsively coupled to said interlaced serial rotational memory storage element for maintaining a one of said $2^M$ addresses corresponding to the one of said $2^M$ cells currently directly adjacent to said memory storage element access point, whereby said one of said $2^M$ addresses so maintained changes with the rotation of said memory storage element, and having a first transferring means responsively coupled to said memory storage subsystem and said CPU for transferring from said CPU to said memory storage subsystem an address corresponding to a one of the $2^N$ cells within a desired one of said $2^{M-N}$ blocks to be accessed by said CPU, and having a means responsively coupled to said maintaining means and said first transferring means for determining from said one of said $2^M$ addresses corresponding to the one of said $2^M$ cells currently directly adjacent to said memory storage element access point and from said one of said $2^M$ addresses corresponding to said one of said $2^N$ cells within said desired one of said $2^{M-N}$ blocks to be accessed by said CPU, an address corresponding to a one of the $2^N$ cells within said desired one of said $2^{M-N}$ blocks to next become adjacent to said memory storage element access point, and having a second transferring means responsively coupled to said determining means and said CPU for transferring said address determined by said determining means to said CPU to permit it to access said desired one of $2^{M-N}$ blocks from said determined address, said determining means comprising:

first disassembly means responsively coupled to said first transferring means for disassembling said requested address transferred from said CPU into a requested block number identifying one of said $2^{M-N}$ blocks to be accessed and a requested word number identifying one of said $2^N$ storage cells within said requested block number;

second disassembly means responsively coupled to said maintaining means for disassembling said address of said storage cell directly adjacent to said memory storage element access point into a memory block number identifying one of said $2^{M-N}$ blocks and a memory word number identifying one of said $2^N$ storage cells within said memory block number;

a comparator responsively coupled to said first disassembly means and said second disassembly means which compares said requested block number with said memory block number;

means responsively coupled to said comparator and said second disassembly means for selectively adding 1 to said memory word number if and only if said comparator indicates said requested block number is less than or equal to said memory block number;

means responsively coupled to said comparator and said second disassembly means for selectively setting to zero said memory word number if said comparator indicates that said one of $2^{M-N}$ blocks to be accessed is not located within that portion of said memory storage element presently adjacent said memory storage element access point; and means responsively coupled to said first disassembly means, said selective adding means, said selective setting means, and said second transferring means for combining said requested block number with said memory word number as potentially modified by said selective adding means to produce said determined address to be transferred to said CPU.

4. In a data processing system according to claim 3:
$M = 4$; and
$N = 2$.

* * * * *

UNITED STATES PATENT AND TRADEMARK OFFICE
CERTIFICATE OF CORRECTION

PATENT NO. : 4232365
DATED : November 4, 1980
INVENTOR(S) : Robert M. Englund

It is certified that error appears in the above-identified patent and that said Letters Patent are hereby corrected as shown below:

<u>IN THE PRINTED PATENT</u>    TABLE B

Column 5, Line 65, "D - 0 - 0 - 1 - 1 - 13" should be -- D - 0 - 0 - 1 - 1 - 12 --.

Signed and Sealed this

Third Day of March 1981

[SEAL]

Attest:

*Attesting Officer*

RENE D. TEGTMEYER

*Acting Commissioner of Patents and Trademarks*